US007498696B2

(12) United States Patent
Sundaram

(10) Patent No.: US 7,498,696 B2
(45) Date of Patent: Mar. 3, 2009

(54) VOLTAGE GRADING AND SHIELDING METHOD FOR A HIGH VOLTAGE COMPONENT IN A PCB AND AN X-RAY APPARATUS

(75) Inventor: Senthil Kumar Sundaram, Sanpada (IN)

(73) Assignee: General Electric Company, Schenectady, NY (US)

( * ) Notice: Subject to any disclaimer, the term of this patent is extended or adjusted under 35 U.S.C. 154(b) by 800 days.

(21) Appl. No.: 10/993,777

(22) Filed: Nov. 20, 2004

(65) Prior Publication Data

US 2006/0109033 A1    May 25, 2006

(51) Int. Cl.
*H04B 3/00*    (2006.01)

(52) U.S. Cl. .................................................. 307/91
(58) Field of Classification Search .................. 307/91
See application file for complete search history.

*Primary Examiner*—Robert L. Deberadinis
(74) *Attorney, Agent, or Firm*—Bill Baxter, Esq.; Michael G. Smith, Esq.; Peter Vogel, Esq.

(57) ABSTRACT

In some embodiments, a voltage grading and shielding method for a high voltage component, is provided. In some embodiments, the method includes configuring at least one first track constructed of a metal or an alloy, at a first location predetermined from the mounting position of the high voltage component, and at least one second track constructed of a metal or an alloy thereof, at a second location predetermined along the length of the high voltage component. In some embodiments, the configured at least one first track substantially reduces the stray capacitance effect and the at least one second track produces a substantially linear voltage distribution along the length of the high voltage component.

20 Claims, 3 Drawing Sheets

VOLTAGE GRADING AND SHIELDING METHOD FOR A HIGH VOLTAGE COMPONENT IN A PCB AND AN X-RAY APPARATUS

FIELD OF THE INVENTION

This invention relates generally to methods for voltage grading and shielding, and more particularly, to a voltage grading and shielding method for a high voltage component e.g. a high voltage resistor divider (bleeder), etc., mounted on a Printed Circuit Board (PCB) e.g. a multiplier PCB used in an X-ray apparatus.

BACKGROUND OF THE INVENTION

In an X-ray apparatus e.g. comprising an X-ray generator, high voltage supply is required for operation of an X-ray tube. The generated high voltage is usually measured with a high voltage component such as, for example, a high voltage resistor divider (bleeder), which also performs an additional function of discharging the capacitors used in a voltage multiplier.

For example, high voltage resistor dividers have usually a substantially long structure to ensure sufficient insulation on its surface. Such a configuration comprising a long structure with high voltage at one end and a near ground electrical potential at the other end is more likely to create a non-uniform electric field distribution along the length of the high voltage resistor divider. Furthermore, the electric field gets distorted depending upon the neighboring components and their electrical potential.

Both the above-mentioned aspects are understood in lumped model as varying distribution of capacitors along the length of the high voltage resistor divider. Thus, the non-uniform distribution of electrical potential along the length of the high voltage divider resistor and the stray capacitance variation depending on neighborhood affects the divider ratio, response and accuracy of measurement.

A known method of grading and shielding a high voltage component such as, for example, a high voltage resistor divider includes arranging the resistor in-between at least a pair of parallel plates that acts as a shield and at the same time provide a linear voltage distribution. However, this arrangement requires use of a special package. Also, the resistor arrangement has a significant capacitance arising due to the parallel plates. Although the capacitance is compensated at the low voltage end, the response (bandwidth) of the divider system becomes low, thereby making the divider limited for measuring fast transients. Further, for compact configuration requirements, a separate arrangement for the high voltage resistor divider is more likely to consume more space and also become expensive.

Thus, the above-mentioned method does not provide a configuration to build a high voltage component e.g. a high voltage divider that is compact. A very compact arrangement can result from mounting the divider in the PCB used for high voltage generation, for example, a multiplier PCB in an X-ray apparatus.

BRIEF DESCRIPTION OF THE INVENTION

The above-mentioned shortcomings, disadvantages and problems are addressed herein, which will be understood by reading and studying the following specification.

In an embodiment, a voltage grading and shielding method for a high voltage component e.g. a high voltage resistor divider mounted on a PCB, is provided. The method includes configuring at least one first track constructed of a metal or an alloy, at a first location predetermined from the mounting position of the high voltage component, and at least one second track constructed of a metal or an alloy, at a second location predetermined along the length of the high voltage component. The configured at least one first track substantially reduces the stray capacitance effect and the at least one second track produces a substantially linear voltage distribution along the length of the high voltage component.

In another embodiment, an X-ray apparatus is provided. The X-ray apparatus comprises a PCB and a high voltage component having a predetermined length mounted on the PCB. The PCB comprises at least one first track and at least one second track constructed of a metal or an alloy. The high voltage component comprises at least one first lead and at least one second lead having a predetermined electrical potential difference. The first track is at a distance predetermined from at least one of the leads, and the second track is at a location defined by a electrical potential gradient along the length of the high voltage component.

Apparatus and methods of varying scope are described herein. In addition to the various aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration, specific embodiments which may be practiced. These embodiments are described in sufficient detail to enable those skilled in the art to practice the embodiments, and it is to be understood that embodiments may be utilized and that logical, mechanical, electrical and other changes may be made without departing from the scope of the embodiments. The following detailed description is, therefore not to be taken in a limiting sense.

Various embodiments of this invention provide a voltage grading and shielding method for a high voltage component such as, for example, a high voltage resistor divider, a high voltage capacitor divider, mounted on a PCB e.g. a multiplier PCB used in an X-ray apparatus. However, the embodiments are not so limited, and may be implemented in connection with other systems such as, for example, medical imaging systems, industrial inspection systems, security scanners, particle accelerators, etc.

In various embodiments, a voltage grading and shielding method for a high voltage component mounted on a PCB is provided, wherein the method comprises configuring at least one first track constructed of a metal or an alloy at a first location for substantially reducing the stray capacitance effect, and configuring at least one second track constructed of a metal or an alloy at a second location for producing a substantially linear voltage distribution along the length of the high voltage component.

Figure 1:
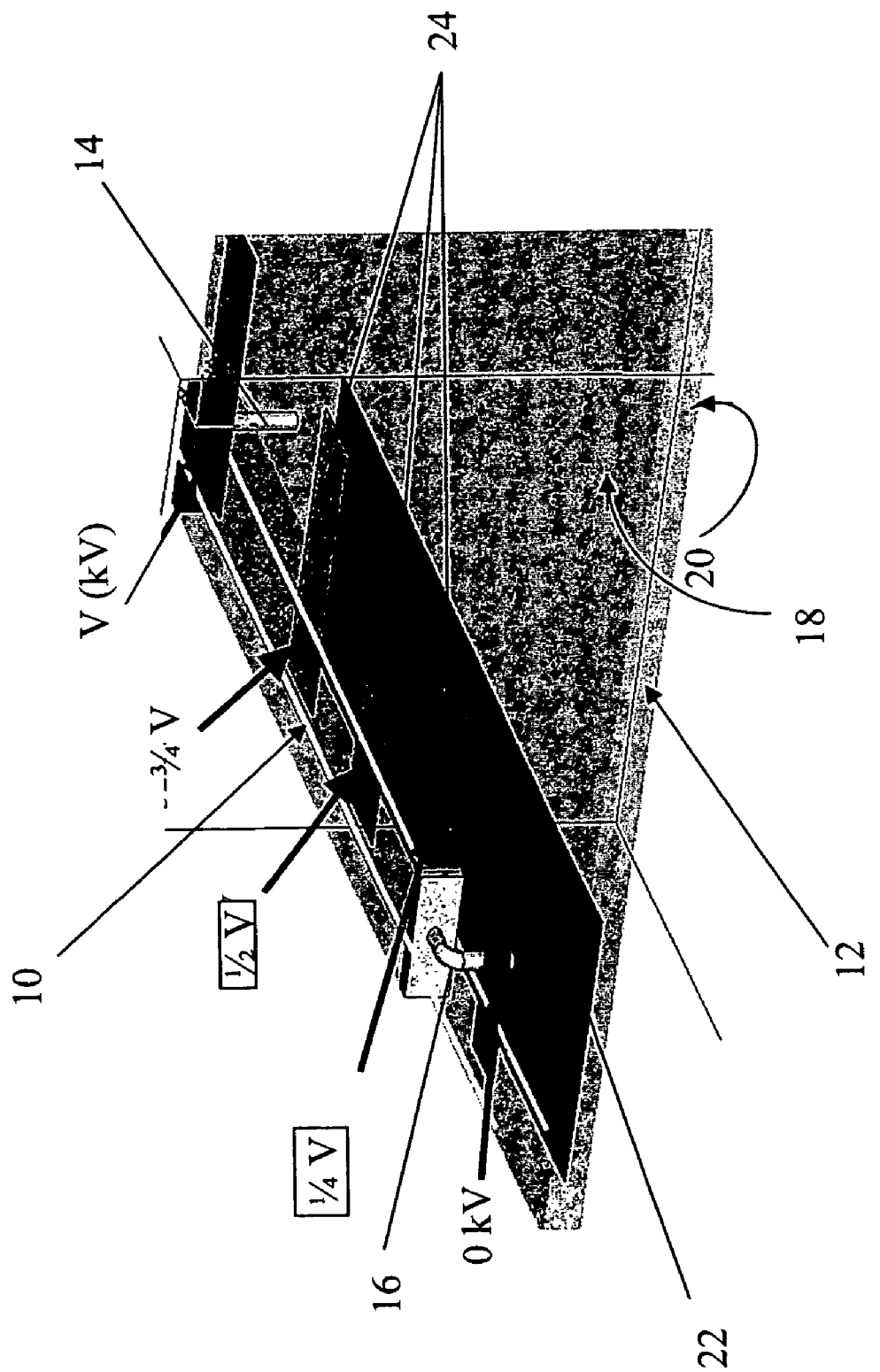
FIG. 1 illustrates a voltage grading and shielding method for a high voltage component on a PCB according to one embodiment of this invention.

FIG. 1 shows an exemplary view of a voltage grading and shielding method for a high voltage component mounted on a PCB, according to one embodiment of this invention.

In the embodiment shown, a high voltage component 10 is mounted onto a PCB 12 such as, for example, a multiplier PCB connected for example, to an X-ray apparatus (not shown). The high voltage component 10 includes at least one first lead 14 having a predetermined high voltage and at least one second lead 16 having a predetermined low voltage. The high voltage component 10 is mounted on to a component side 18 of the PCB 12 and soldered on a solder side 20 of the PCB 10.

In an embodiment, the high voltage component 10 includes a high voltage resistor divider having at least one of a substantially high ohmic value, flat and thin dimensions.

For example, the high voltage resistor is constructed of an insulation substrate having either a substantially thick or thin metalized film coating on the surface.

In one example, the first lead 14 has a voltage of about 42 kV and the second lead has nearly ground electrical potential.

In other examples, the first lead 14 and the second lead 16 may have varying voltages, wherein the difference in voltages between the first lead 14 and the second lead 16 is substantially high.

In an embodiment, at least one first track 22 is provided on the solder side 20 of the PCB 12, the first track 22 being maintained at substantially ground electrical potential.

It should be noted that the first track 22 is provided at a distance predetermined to maintain sufficient creepage from the first lead 14.

It should also be noted that the area of the first track 22 is kept maximum to ensure effective control of the stray capacitance effect.

In one example, the first track 22 is configured from an etched copper layer on the PCB 12.

In another example, the first track 22 may be constructed from a metal or a metal alloy such as, for example, copper, tin, alumnium sheet or foil which may be secured to the PCB 12 and is adapted for substantially reducing the stray capacitance effect.

Figure 2:
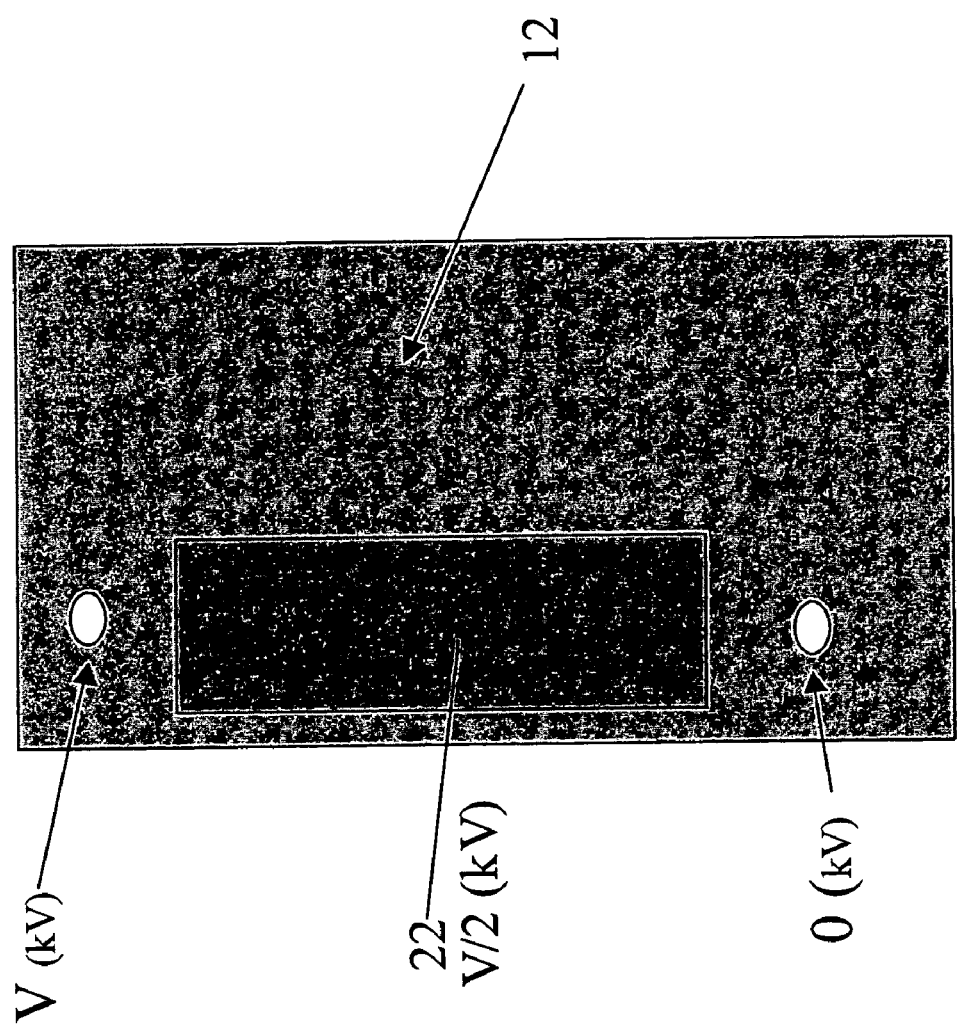
FIG. 2 is an embodiment wherein the shield is maintained at half the maximum electrical potential.
Figure 3:
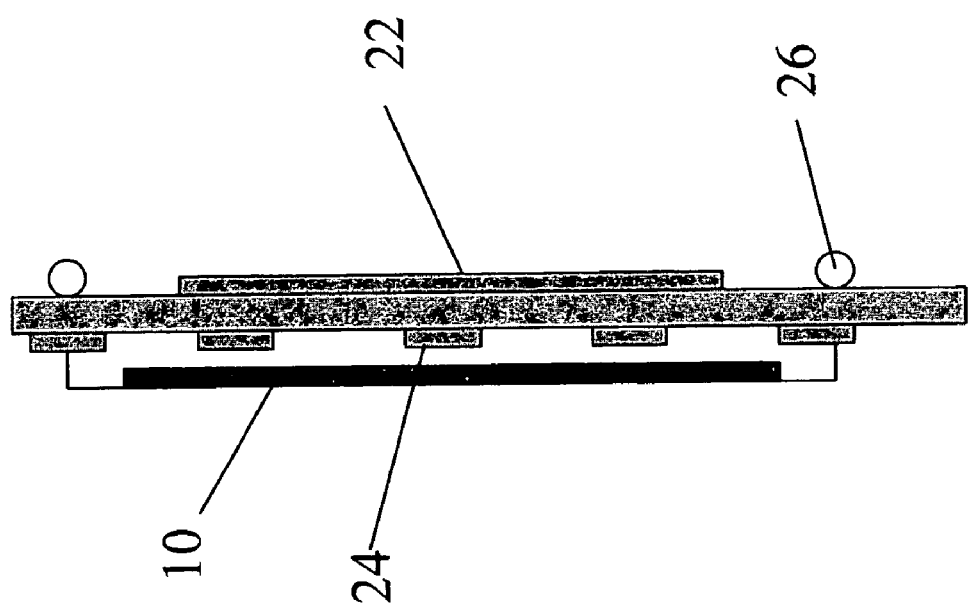
FIG. 3 is the side view of FIG. 2.

FIG. 2 and FIG. 3 show an embodiment wherein, the first track 22 is maintained at an elevated electrical potential e.g. at a electrical potential substantially equal to half of the maximum electrical potential of the high voltage component 10 and sufficiently insulated with leads 14 and 16.

It should be noted that maintaining the first track 22 at a electrical potential substantially equal to half of the maximum electrical potential significantly reduces the electrical stress on the PCB 12 for example, in a thin PCB and also increases dynamic response of the high voltage component 10 by balancing the stray capacitance effect in-between the first lead 14 and the second lead 16.

In the embodiment shown in FIG. 2, the first track 22 is disposed at the solder (26) side (20) of the PCB 12.

In an embodiment, at least one second track 24 is provided on the component side of the PCB 12.

For example, the second track 24 is provided at a plurality of locations predetermined along the length of the high voltage component 10.

For example, the position of each second track 24 is predetermined based on the desired electrical potential gradient along the length of the high voltage component 10.

As illustrated in the embodiment shown in FIG. 1, it should be noted that each second track 24 is coupled to at least one of a plurality of voltage sources (not shown) configured within PCB 10. This configuration forces the electrical potential at specific locations along the length of the high voltage component 10, to become substantially equal to the electrical potentials of second tracks 24 corresponding to that specific location, (as shown in FIG. 1) thereby producing a substantially linear voltage distribution (grading) along the length of the high voltage component 10.

It should also be noted that the configuration with first and second tracks 22, 24 produces linear voltage distribution along the upper surface of the high voltage component 10.

It should be noted that the number of second tracks 24 to be provided is dependent upon the length of the high voltage component 10.

In an embodiment, at least one second track 24 is configured from an etched copper layer on the component side of the PCB 12.

In other embodiments, the second track 24 may be constructed of a metal or an alloy layer and secured to the component side of the PCB 12.

In a further embodiment, a plurality of grading (not shown) such as, for example, metallic rings, metallic bars having at least one of a substantially semi-circular shape or a square shape, are mounted around the high voltage component 10 and coupled to the second tracks 24.

It should be noted that this configuration increases the grading effect substantially along the upper and side surfaces of the high voltage component 10. Stray capacitance is substantially reduced such that the first track 22 at the solder side 20 may be eliminated.

It should also be noted that a high voltage component 10 having a substantially cylindrical configuration, large thickness and/diameter, provides an improved grading and shielding effect along the entire circumferential surface of the high voltage component.

Thus, various embodiments of this invention provide a voltage grading and shielding method for a high voltage component mounted on a PCB. Further embodiments of this invention provide an X-ray apparatus, comprising a compact configuration for voltage grading and shielding a high voltage component in a PCB.

Accordingly, the method and apparatus according to this invention provides a uniform stress distribution along the length of the high voltage component, thereby allowing a shortened length for the high voltage component, resulting in a significantly compact structure for the PCB.

While the invention has been described in terms of various specific embodiments, those skilled in the art will recognize that the invention can be practiced with modifications such as, for example, the tracks may be configured to perform other electrical functions in addition to grading and shielding. However, all such modifications are deemed to have been covered within the scope of the claims appended hereto.

What is claimed is:

1. A method for grading voltage and shielding a high voltage component in a PCB, comprising:
   configuring at least one first track constructed of a metal or an alloy, at a first location predetermined from the mounting position of the high voltage component on the PCB; and
   configuring at least one second track constructed of a metal or an alloy, at a second location predetermined along the length of the high voltage component, wherein:
   the at least one first track substantially reduces a stray capacitance effect; and
   the at least one second track produces a substantially linear voltage distribution along the length of the high voltage component.

2. The method of claim 1 further comprising:
   configuring the PCB with a component side and a solder side, wherein the at least one first track is configured at the solder side of the PCB.

3. The method of claim 2 further comprising:
configuring the high voltage component with a first lead having a predetermined high voltage and a second lead having a predetermined low voltage,
wherein the at least one first track is configured at a distance predetermined to maintain sufficient creepage from the first lead.

4. The method of claim 3 further comprising:
maintaining the at least one first track at a ground electrical potential.

5. The method of claim 3 further comprising:
maintaining the at least one first track at a electrical potential substantially half of the maximum electrical potential of the high voltage component,
wherein a predetermined creepage is maintained from the first and second leads.

6. The method of claim 1 further comprising:
configuring the at least one first track from an etched copper layer on the PCB.

7. The method of claim 1 further comprising:
configuring the at least one second track at a location defined by a desired electrical potential gradient along the length of the high voltage component.

8. The method of claim 7 further comprising:
configuring the at least one second track from an etched copper layer on the PCB.

9. The method of claim 8 further comprising:
coupling the at least one second track to at least one voltage source configured within the PCB,
wherein the electrical potential along the length of the high voltage component is maintained in response to the electrical potential at the track.

10. The method of claim 1 further comprising:
disposing a plurality of grading and shielding elements around the high voltage component,
wherein the grading and shielding elements are coupled to the at least one second track.

11. An X-ray apparatus comprising:
a PCB
a high voltage component having a predetermined length mounted on the PCB,
the PCB having at least one first track and at least one second track constructed of a metal or an alloy, and
the high voltage component having at least one first lead and at least one second lead having a predetermined electrical potential difference,
wherein the first track is at a distance predetermined from at least one of the leads, and
the second track is at a location defined by a electrical potential gradient along the length of the high voltage component.

12. The X-ray apparatus of claim 11 wherein the PCB further comprises:
a component side; and
a solder side,
wherein the at least one first track is configured at the solder side of the PCB.

13. The X-ray apparatus of claim 12 wherein the first track further comprises:
configured at a distance predetermined to maintain sufficient creepage from the first lead.

14. The X-ray apparatus of claim 13 wherein the first track further comprises:
maintained at a ground electrical potential.

15. The X-ray apparatus of claim 13 wherein the first track further comprises:
an electrical potential equal to substantially half of the maximum electrical potential of the high voltage component.

16. The X-ray apparatus of claim 11 wherein the at least one first track further comprises:
a copper layer etched on the PCB.

17. The X-ray apparatus of claim 16 further comprising:
a plurality of voltage sources on the PCB,
wherein the at least one second track is coupled to at least one of the voltage sources on the PCB, and the electrical potential along the length of the high voltage component is maintained in response to the electrical potential at the track.

18. The X-ray apparatus of claim 11 further comprising:
a plurality of grading and shielding elements around the high voltage component,
wherein the grading and shielding elements are coupled to the at least one second track.

19. The X-ray apparatus of claim 11 wherein the high voltage component further comprises:
a high voltage resistor divider configured to have a predetermined fast response for transient and high frequency ripple measurement.

20. An X-ray apparatus comprising:
a PCB
a substantially cylindrical high voltage component mounted on the PCB;
at least one track constructed of a metal or an alloy, disposed at a location predetermined along the length of the high voltage component; and
a plurality of grading and shielding elements are disposed around the high voltage component, in connection with the at least one track.

* * * * *